United States Patent
Chang et al.

(10) Patent No.: US 12,272,646 B2
(45) Date of Patent: Apr. 8, 2025

(54) SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Shih-Fang Tzou, Tainan (TW); Fu-Che Lee, Taichung (TW); Chien-Cheng Tsai, Kaohsiung (TW); Feng-Ming Huang, Pingtung County (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/226,750

(22) Filed: Jul. 26, 2023

(65) Prior Publication Data
US 2023/0369215 A1  Nov. 16, 2023

Related U.S. Application Data

(60) Division of application No. 17/467,287, filed on Sep. 6, 2021, now Pat. No. 11,769,727, which is a (Continued)

(30) Foreign Application Priority Data

Dec. 30, 2016 (CN) .......................... 201611258003.0

(51) Int. Cl.
*H01L 23/52* (2006.01)
*H01L 21/311* (2006.01)
(Continued)

(52) U.S. Cl.
CPC .... *H01L 23/5283* (2013.01); *H01L 21/31111* (2013.01); *H01L 21/76224* (2013.01);
(Continued)

(58) Field of Classification Search
CPC .......... H01L 23/5283; H01L 21/31111; H01L 21/76224; H01L 21/76802;
(Continued)

(56) References Cited

U.S. PATENT DOCUMENTS 6,228,700 B1 * 5/2001 Lee ...................... H10B 12/485
438/238
7,078,292 B2 7/2006 Park
(Continued)

FOREIGN PATENT DOCUMENTS

CN 105719998 A 6/2016

*Primary Examiner* — Mohammed Shamsuzzaman
(74) *Attorney, Agent, or Firm* — Winston Hsu

(57) ABSTRACT

A semiconductor memory device and a manufacturing method thereof are provided in the present invention. An under-cut structure is formed at an edge of a bit line contact opening in the process of forming the bit line contact opening for avoiding short problems caused by alignment shifting, and the process window of the process of forming the bit line contact opening may be improved accordingly.

8 Claims, 4 Drawing Sheets

Related U.S. Application Data continuation of application No. 16/446,590, filed on Jun. 19, 2019, now Pat. No. 11,139,243, which is a division of application No. 15/856,089, filed on Dec. 28, 2017, now Pat. No. 10,381,306.

(51) Int. Cl.
| | |
|---|---|
| *H01L 21/762* | (2006.01) |
| *H01L 21/768* | (2006.01) |
| *H01L 23/522* | (2006.01) |
| *H01L 23/528* | (2006.01) |
| *H01L 29/06* | (2006.01) |
| *H10B 12/00* | (2023.01) |

(52) U.S. Cl.
CPC .. *H01L 21/76802* (2013.01); *H01L 21/76831* (2013.01); *H01L 21/76877* (2013.01); *H01L 23/5226* (2013.01); *H01L 29/0649* (2013.01); *H10B 12/482* (2023.02); *H10B 12/485* (2023.02)

(58) Field of Classification Search
CPC ......... H01L 21/76831; H01L 21/76877; H01L 23/5226; H01L 29/0649; H10B 12/482; H10B 12/485; H10B 12/30
See application file for complete search history.

(56) References Cited

U.S. PATENT DOCUMENTS

| | | | | |
|---|---|---|---|---|
| 7,998,870 B2* | 8/2011 | Nam | ............... | H01L 27/0207 438/700 |
| 8,871,593 B1* | 10/2014 | Siemieniec | ......... | H01L 29/7397 438/176 |
| 9,177,891 B2* | 11/2015 | Kim | ............... | H01L 23/5329 |
| 9,230,858 B2 | 1/2016 | Kim | | |
| 9,349,633 B2* | 5/2016 | Kim | ............... | H10B 12/053 |
| 9,496,381 B2* | 11/2016 | Lee | ............... | H01L 29/78 |
| 9,564,442 B2* | 2/2017 | Tang | ............... | H10B 12/30 |
| 9,570,391 B2* | 2/2017 | Im | ............... | H10B 12/482 |
| 9,679,982 B2* | 6/2017 | Kim | ............... | H01L 29/7827 |
| 12,114,486 B2* | 10/2024 | Wan | ............... | H10B 12/485 |
| 2001/0004540 A1* | 6/2001 | Bronner | ............... | H10B 12/053 257/E27.092 |
| 2002/0089014 A1* | 7/2002 | Chern | ............... | H10B 69/00 257/326 |
| 2006/0081913 A1* | 4/2006 | Kim | ............... | H01L 21/76831 257/E27.081 |
| 2008/0003866 A1* | 1/2008 | Bae | ............... | H01L 21/76831 439/417 |
| 2009/0020808 A1* | 1/2009 | Yu | ............... | H10B 12/053 257/334 |
| 2009/0020880 A1* | 1/2009 | Paik | ............... | H10B 12/482 257/773 |
| 2009/0085083 A1 | 4/2009 | Shin | | |
| 2011/0260238 A1* | 10/2011 | Kim | ............... | H10B 12/485 257/E21.546 |
| 2011/0260328 A1 | 10/2011 | Nam | | |
| 2012/0126426 A1 | 5/2012 | Shin | | |
| 2012/0153456 A1* | 6/2012 | Kim | ............... | H01L 21/76897 438/653 |
| 2012/0153481 A1* | 6/2012 | Ahn | ............... | H01L 23/485 438/653 |
| 2012/0326214 A1* | 12/2012 | Cho | ............... | H01L 21/28008 257/E21.546 |
| 2013/0119462 A1* | 5/2013 | Kye | ............... | H10B 12/485 438/586 |
| 2014/0127903 A1* | 5/2014 | Kim | ............... | H01L 21/7685 438/653 |
| 2015/0056805 A1* | 2/2015 | Park | ............... | H01L 21/76804 438/672 |
| 2015/0214344 A1 | 7/2015 | Benoit | | |
| 2015/0263136 A1* | 9/2015 | Hsiao | ............... | H01L 29/42376 438/283 |
| 2015/0340453 A1* | 11/2015 | Cho | ............... | H01L 29/7831 257/330 |
| 2016/0027727 A1* | 1/2016 | Kim | ............... | H10B 12/34 257/774 |
| 2016/0035731 A1* | 2/2016 | Lee | ............... | H01L 21/31111 257/334 |
| 2016/0181143 A1* | 6/2016 | Kwon | ............... | H01L 29/6653 438/586 |
| 2016/0181198 A1* | 6/2016 | Kim | ............... | H10B 12/50 257/532 |
| 2018/0182856 A1* | 6/2018 | Lee | ............... | H01L 23/485 |
| 2018/0240705 A1* | 8/2018 | Chang | ............... | H01L 21/76224 |

* cited by examiner

SEMICONDUCTOR MEMORY DEVICE

CROSS REFERENCE TO RELATED APPLICATIONS

This application is a division of U.S. application Ser. No. 17/467,287, filed on Sep. 6, 2021, which is a continuation application of U.S. application Ser. No. 16/446,590, filed on Jun. 19, 2019, which is a division of U.S. application Ser. No. 15/856,089, filed on Dec. 28, 2017. The contents of these applications are incorporated herein by reference.

BACKGROUND OF THE INVENTION

1. Field of the Invention

The present invention relates to a semiconductor memory device and a manufacturing method thereof, and more particularly to a semiconductor memory device having a bit line contact opening and a manufacturing method thereof.

2. Description of the Prior Art

The manufacture of integrated circuits keeps improving as the related technologies progress. Many kinds of electric circuits may be integrated and formed on a single chip. The semiconductor process for chip manufacturing may include many steps, such as a deposition process for forming a thin film, a photoresist coating process, an exposure process, and a develop process for forming a patterned photoresist, and an etching process for patterning the thin film. The sizes of the circuits and the devices on the chip become smaller continuously for the product specification, and the process window of the manufacturing processes mentioned above becomes narrower accordingly. Therefore, the related industries keep making efforts to increase the process window under the limitations of product specification and design requirements for enhancing the manufacturing yield.

SUMMARY OF THE INVENTION

The present invention provides a semiconductor memory device and a manufacturing method thereof utilized for forming an under-cut structure at an edge of a bit line contact opening when forming the bit line contact opening, so as to improve a problem of short circuit due to a misalignment and increase a process window of the bit line contact opening.

An embodiment of the present invention provides a semiconductor memory device including a semiconductor substrate, a plurality of shallow trench isolations, a bit line contact opening, a bit line structure, and an isolation structure. The semiconductor substrate includes a plurality of active regions. The shallow trench isolations are disposed in the semiconductor substrate. Each of the shallow trench isolations is disposed between the active regions. The bit line contact opening is disposed in one of the active regions and disposed in the shallow trench isolations, and an edge of the bit line contact opening has an under-cut structure. The bit line structure is partially disposed in the bit line contact opening and in contact with one of the active regions corresponding to the bit line contact opening. The isolation structure is disposed in the under-cut structure of the bit line contact opening. A distance between a sidewall of the bit line structure and a topmost portion of an outermost sidewall of the under-cut structure is less than a distance between the sidewall of the bit line structure and a bottommost portion of the outermost sidewall of the under-cut structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic drawings of a manufacturing method of a semiconductor memory device according to a first embodiment of the present invention, wherein FIG. 2 is a schematic drawing showing a cross-section taken along the line A-A' in FIG. 1;

FIG. 3 is a schematic drawing showing a status after FIG. 2;

FIG. 4 is a schematic drawing showing a status after FIG. 3;

FIG. 5 is a schematic drawing showing a status after FIG. 4;

FIG. 6 is a schematic drawing showing a status after FIG. 5.

FIG. 7 and FIG. 8 are schematic drawings of a manufacturing method of a semiconductor memory device according to a second embodiment of the present invention, wherein FIG. 8 is a schematic drawing showing a status after FIG. 7.

DETAILED DESCRIPTION

Figure 1:
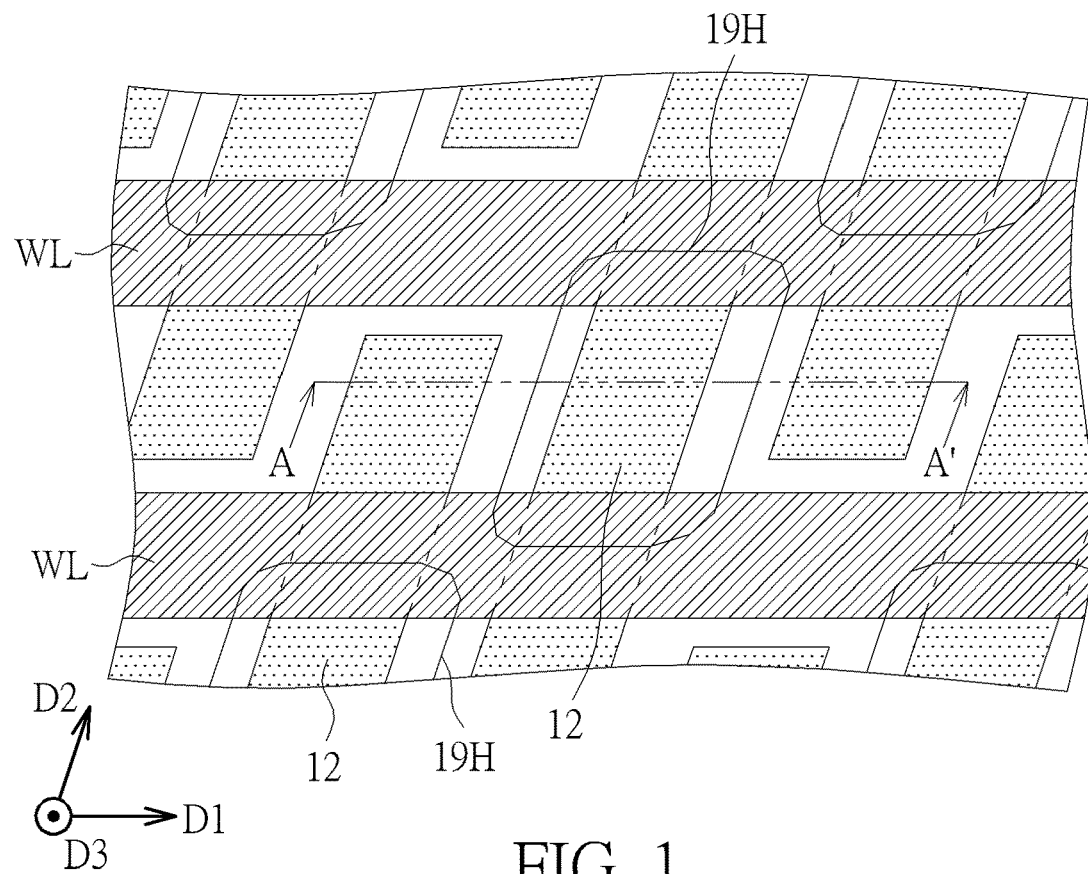
Figure 2:
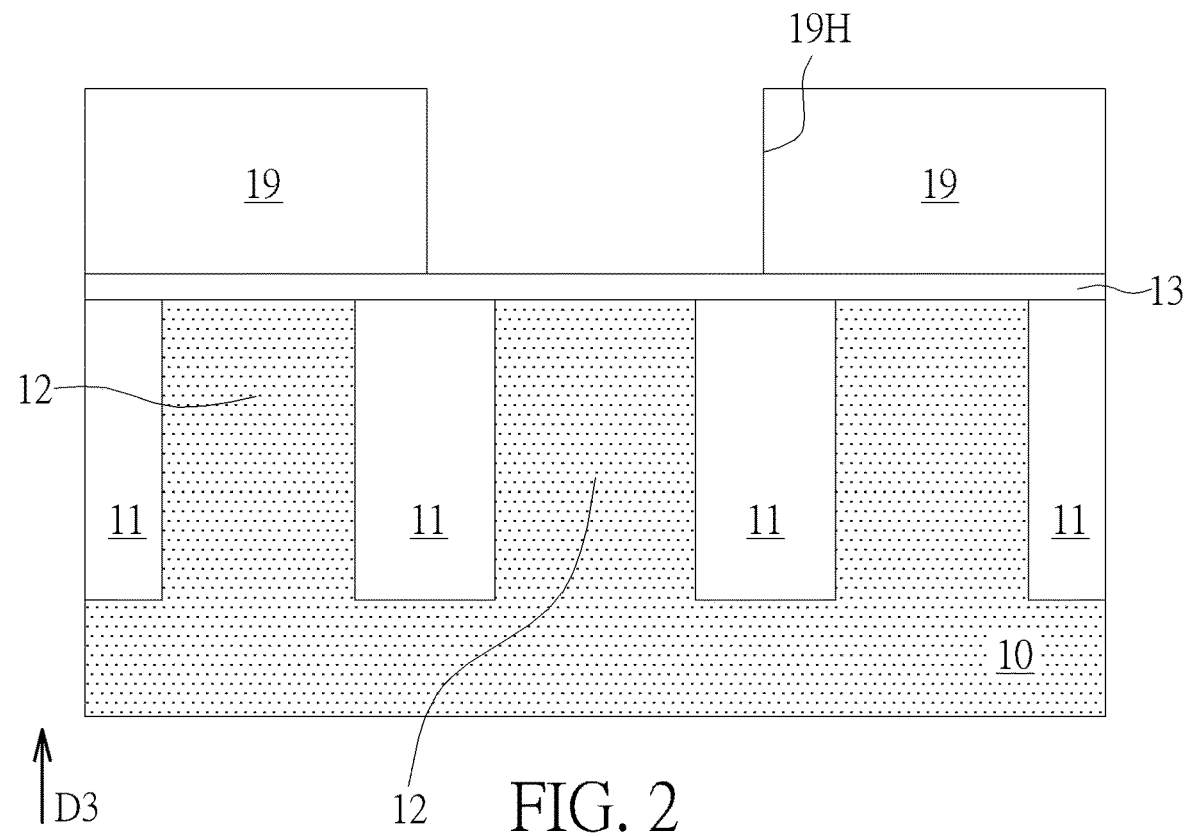

Please refer to FIG. 1 to FIG. 6, FIG. 1 to FIG. 6 are schematic drawings of a manufacturing method of a semiconductor memory device according to a first embodiment of the present invention, wherein FIG. 1 is a top-view schematic drawing, FIG. 2 to FIG. 6 are cross-section-view schematic drawings, and FIG. 2 is a schematic drawing showing a cross-section taken along the line A-A' in FIG. 1. This embodiment provides a manufacturing method of the semiconductor memory device including following steps. Firstly, as shown in FIG. 1 and FIG. 2, a semiconductor substrate 10 is provided. The semiconductor substrate 10 may include a silicon substrate, an epitaxial silicon substrate, a silicon germanium substrate, a silicon carbide substrate or a silicon-on-insulator (SOI) substrate, but not limited thereto. A shallow trench isolation 11 is formed in the semiconductor substrate 10 and defines a plurality of active regions 12. In the forming process of the shallow trench isolation 11, a plurality of trenches may be formed in the semiconductor substrate 10 by an etching method, and then, insulating material such as silicon oxide or silicon oxynitride may be filled into the trenches to form the shallow trench isolation 11, but not limited thereto. In some embodiments, the shallow trench isolation 11 may be formed by other suitable methods as requirement. In addition, a plurality of word lines WL may be formed in the semiconductor substrate 10, and the word lines WL of this embodiment may be buried word lines, but not limited thereto. In some embodiments, each of the word lines WL may extend along a first direction D1, and each of the active regions 12 may extend along a second direction D2 different from the first direction D1. Moreover, the second direction D2 may not be orthogonal to the first direction D1, and each of the active regions 12 may extend along this oblique direction, so as to increase an arrangement density of memory cells, but not limited thereto.

After the shallow trench isolation 11 and the word lines WL are formed, a patterned mask layer 19 may be formed on the semiconductor substrate 10 and the shallow trench isolation 11. The patterned mask layer 19 may have a plurality of openings 19H respectively corresponding to a portion of the active regions 12, so as to be utilized for forming a plurality of bit line contact openings (not shown in FIG. 1 and FIG. 2) in the semiconductor substrate 10 with an etching process. Moreover, before forming the patterned mask layer 19, a mask layer 13 may be formed and cover the semiconductor substrate 10 and the shallow trench isolation 11, and then, the patterned mask layer 19 is formed on the mask layer 13. The mask layer 13 may include insulating material such as silicon nitride, and the patterned mask layer 19 may include photoresist, but not limited thereto. Thus, each of the openings 19H of the patterned mask layer 19 is corresponding to one of the active regions 12 in a vertical direction D3, and each of the openings 19H may expose the mask layer 13 on the corresponding active region 12.

Figure 3:
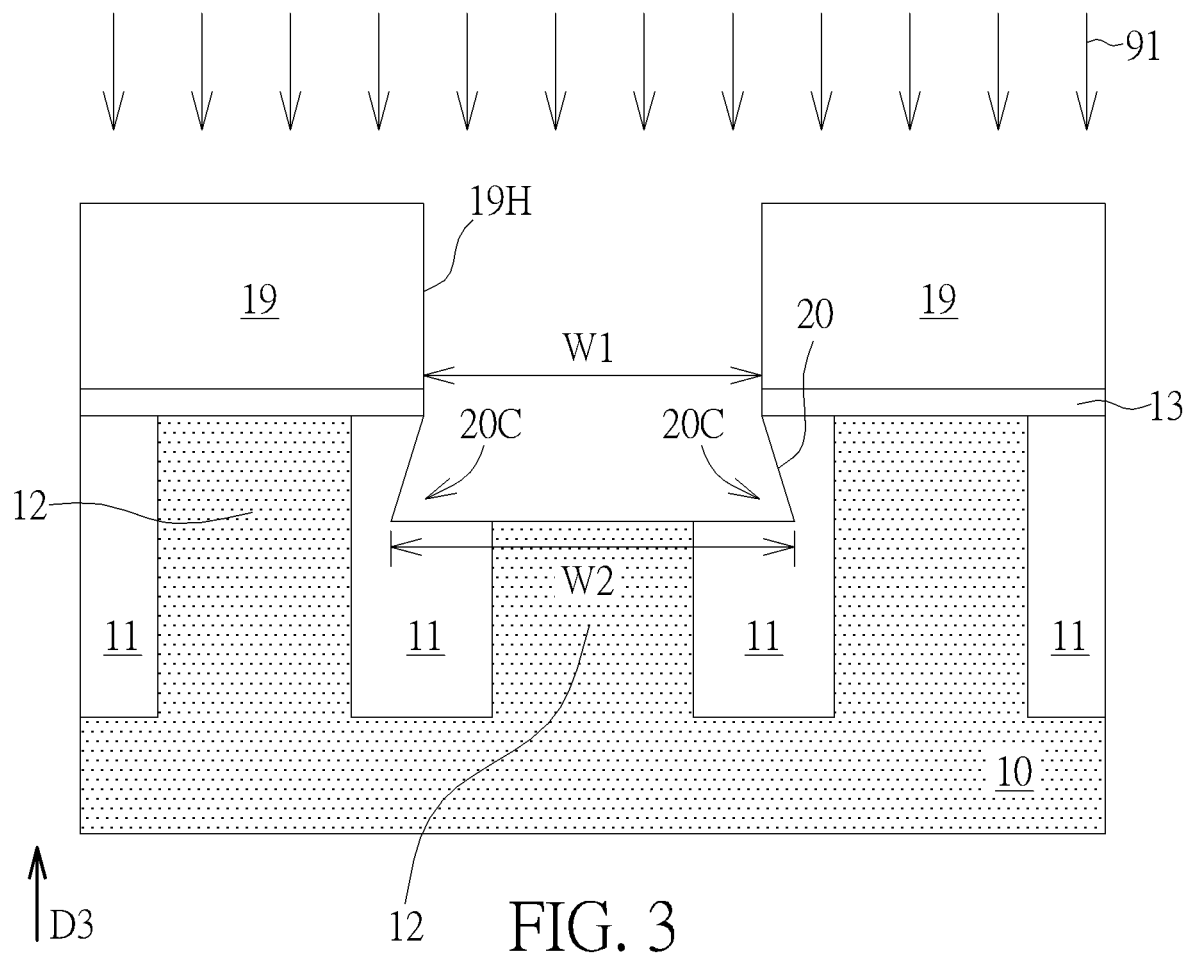

Next, as shown in FIG. 3, a first etching process 91 is performed for forming a bit line contact opening 20 in the semiconductor substrate 10. Because the first etching process 91 is performed with the patterned mask layer 19 as an etching mask, each bit line contact opening 20 is formed corresponding to and exposes one of the active regions 12. Specifically, the first etching process 91 may remove the mask layer 13 exposed by the opening 19H of the patterned mask layer 19, and further etch downwards and remove a portion of the active region 12 and a portion of the shallow trench isolation 11, so as to form the bit line contact opening 20. In this embodiment, an edge of the bit line contact opening 20 has a under-cut structure 20C, so a bottom width of the bit line contact opening 20 (such as a second width W2 shown in FIG. 3) is greater than a top width of the bit line contact opening 20 (such as a first width W1 shown in FIG. 3). In other word, the bit line contact opening 20 of this embodiment is an opening of which a bottom is wider than a top.

In some embodiments, the under-cut structures 20C of the bit line contact opening 20 may be formed in the shallow trench isolations 11 at two sides of the active region 12 corresponding to the bit line contact opening 20, but not limited thereto. Furthermore, the first width W1 of the bit line contact opening 20 may be approximately equal to the sum of a width of the active region 12 and a width of the shallow trench isolation 11 between the active regions 12. Since the second width W2 is greater than the first width W1, the remainder of the active region 12 after performing the first etching process 91 would be improved when the opening 19H of the patterned mask layer 19 is misaligned. In order to form the under-cut structure 20C, the first etching process 91 may be similar to an isotropic etching, and the etching profile of the under-cut may be adjusted by controlling an etching selectivity between the mask layer 13 and the shallow trench isolation 11 in the first etching process 91, but not limited thereto. In some embodiments, the first etching process 91 may include a plurality of etching steps depending on requirements; for example, the first etching process 91 may include different etching steps configured to respectively etch the mask layer 13, the active regions 12 and/or the shallow trench isolation 11 to form the under-cut structure 20C.

Figure 4:
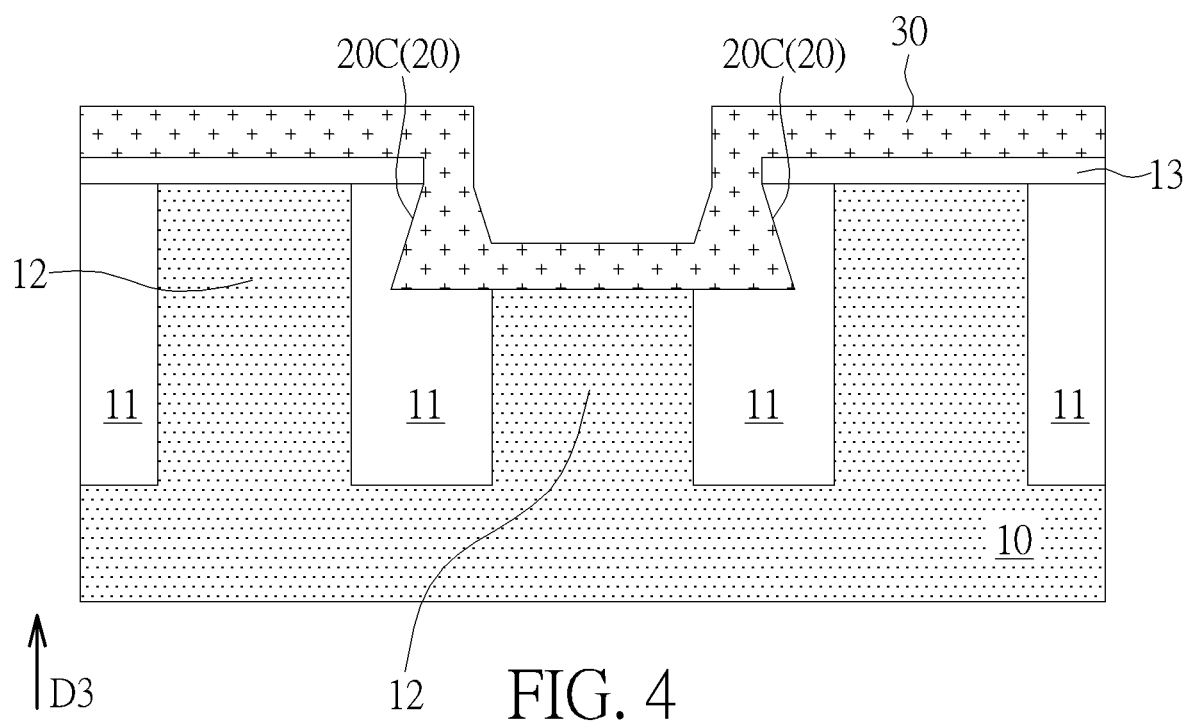
Figure 5:
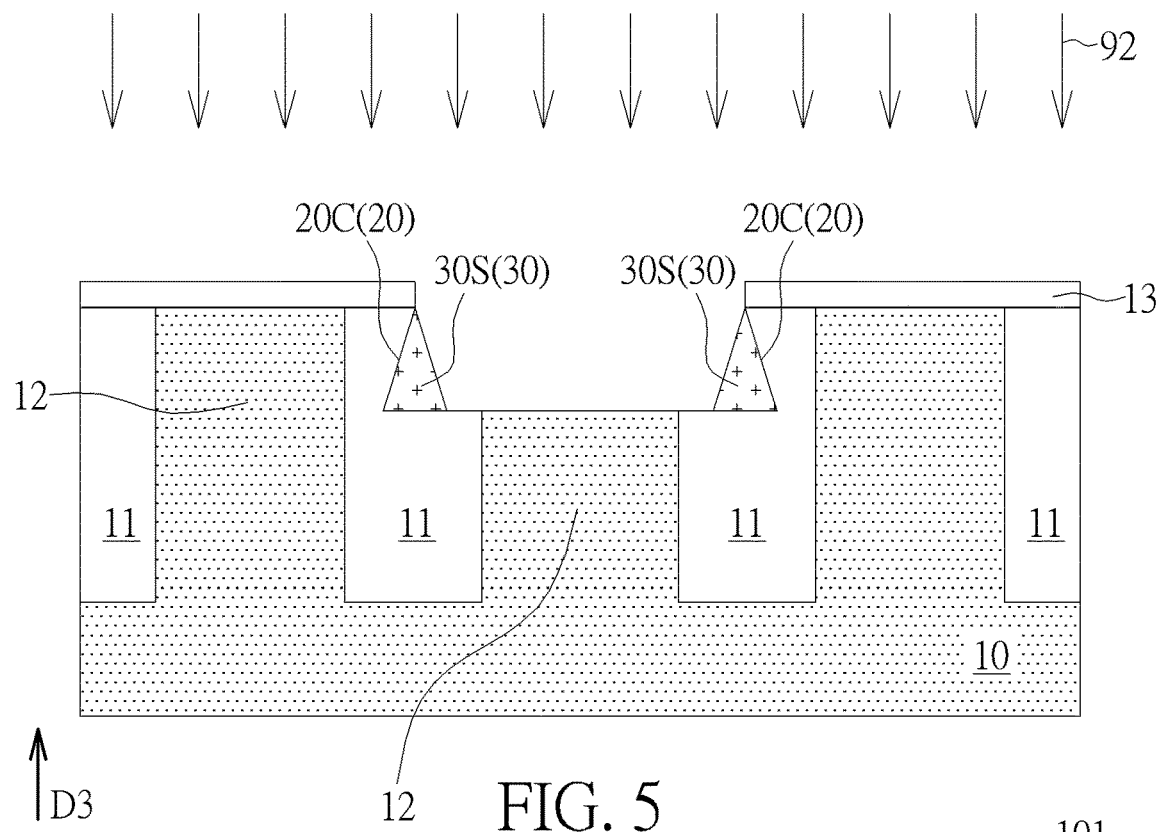
Figure 6:
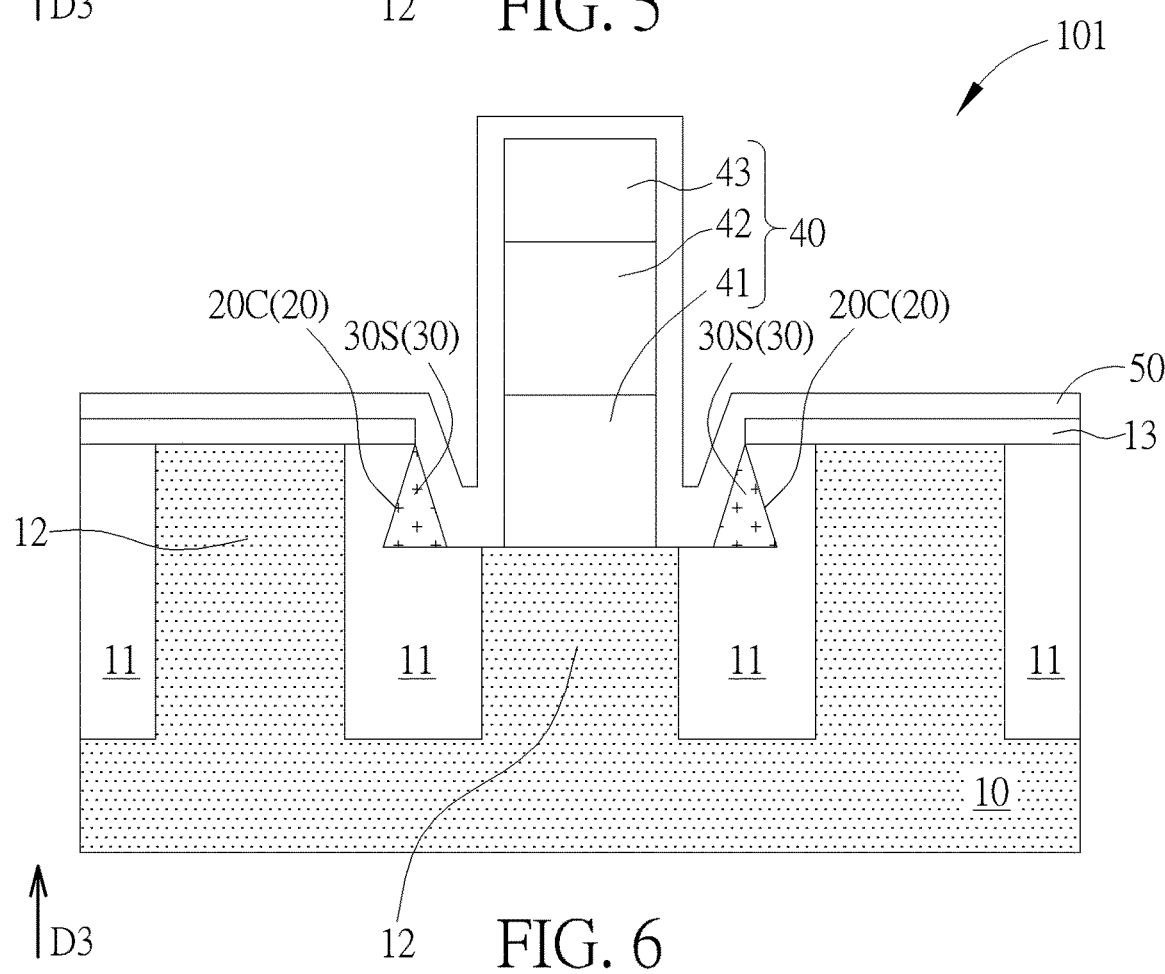

Then, one bit line structure or more than one bit line structures is formed on the semiconductor substrate 10. For example, as shown in FIG. 4 to FIG. 6, a bit line structure 40 is formed on the semiconductor substrate 10. Only one bit line structure 40 is shown in FIG. 4 to FIG. 6, but the present invention is not limited to form one bit line structure 40. In some embodiments, a plurality of bit line structures 40 may be formed on the semiconductor substrate 10. The bit line structure 40 is partially disposed in the bit line contact opening 20, and the bit line structure 40 is in contact with the active region 12 corresponding to the bit line contact opening 20. The bit line structure 40 may include a contact plug 41, a low resistance layer 42 and a cap layer 43 stacking in the vertical direction D3. The contact plug 41 may include conductive material containing silicon, such as poly-silicon or amorphous-silicon, the low resistance layer 42 may include material with low electric resistivity, such as aluminum (Al), tungsten (W), copper (Cu), titanium aluminide (TiAl) or other suitable materials, and the cap layer 43 may include insulating material, such as silicon nitride, but not limited thereto. In addition, a barrier layer (not shown in figure) may be formed between the contact plug 41 and the low resistance layer 42 depending on requirements. The material of the barrier layer may include titanium, tungsten suicide (WSi), tungsten nitride (WN) or other suitable barrier materials. Note that an isolation structure 30S may be formed in the under-cut structure 20C of the bit line contact opening 20 before the bit line structure 40 is formed, and a bottom of the isolation structure 30S is wider than a top of the isolation structure 30S.

Furthermore, a manufacturing method of the isolation structure 30S of this embodiment may include but is not limited to the following steps. Firstly, as shown in FIG. 4, an insulating layer 30 is formed on the semiconductor substrate 10 and in the bit line contact opening 20, and the under-cut structure 20C of the bit line contact opening 20 is filled with the insulating layer 30. The insulating layer 30 may include insulating material, such as silicon nitride, silicon oxynitride or other suitable insulating materials. Then, as shown in FIG. 4 to FIG. 5, a second etching process 92 is performed to the insulating layer 30 for removing the insulating layer 30 outside the bit line contact opening 20 and a portion of the insulating layer 30 in the bit line contact opening 20, so as to form the isolation structure 30S in the under-cut structure 20C. Note that the second etching process 92 of this embodiment may be an anisotropic etching process utilized for removing the insulating layer 30 on the mask layer 13 and the active regions 12 and keeping the insulating layer 30 in the under-cut structure 20C, so as to form the isolation structure 30S of which the bottom is wider than the top. In other words, the second etching process 92 utilized for forming the isolation structure 30S is performed before forming the bit line structure 40.

Moreover, as shown in FIG. 6, after the bit line structure 40 is formed, a spacer layer 50 may be formed on the semiconductor substrate 10 and the bit line structure 40. The spacer layer 50 may be formed conformally on the mask layer 13, a side surface of the isolation structure 30S toward the bit line structure 40, the bit line structure 40 and other surfaces in the bit line contact opening 20. Therefore, the spacer layer 50 is partially formed in the bit line contact opening 20, and a portion of the spacer layer 50 is formed between the isolation structure 30S and the bit line structure 40. In other words, the spacer layer 50 may be filled into a spacing between the isolation structure 30S and the bit line structure 40. The spacer layer 50 may include insulating material, such as silicon nitride, silicon oxynitride or other suitable insulating materials, but not limited thereto.

Through the manufacturing method described above, the semiconductor memory device 101 shown in FIG. 6 may be formed. The semiconductor memory device 101 of this embodiment includes the semiconductor substrate 10, the shallow trench isolation 11, the bit line contact opening 20 and the bit line structure 40. The semiconductor substrate 10 includes a plurality of the active regions 12. The shallow trench isolation 11 is disposed in the semiconductor substrate 10, and the shallow trench isolation 11 is disposed between the active regions 12. The bit line contact opening 20 is disposed in one of the active regions 12 and disposed in the shallow trench isolation 11, and the edge of the bit line contact opening 20 has the under-cut structure 20C. The bit line structure 40 is partially disposed in the bit line contact opening 20, and the bit line structure 40 is in contact with the active region 12 corresponding to the bit line contact opening 20 and electrically connected to the active region 12. Moreover, the semiconductor memory device 101 may further include the isolation structure 30S disposed in the under-cut structure 20C of the bit line contact opening 20, and the bottom of the isolation structure 30S is wider than the top of the isolation structure 30S. In some embodiments, a cross-section shape of the isolation structure 30S may include a triangle, a trapezoid or other regular or irregular shapes having a bottom wider than a top. In addition, the semiconductor memory device 101 may further include the spacer layer 50 partially disposed on the bit line structure 40 and partially disposed in the bit line contact opening 20, and a portion of the spacer layer 50 may be disposed between the isolation structure 30S and the bit line structure 40 for being filled into the spacing between the isolation structure 30S and the bit line structure 40. In the condition that the width of the shallow trench isolation 11 between the active regions 12 is decreased due to increasing the density of the memory cells, since the bottom width of the bit line contact opening 20 is greater than the top width of the bit line contact opening 20, it is ensured that the portion of the active regions 12 required to be removed may be removed clearly when forming the bit line contact opening 20, so as to prevent other conductive line (such as a subsequently-formed storage node contact) and the bit line structure 40 adjacent to this conductive line from occurring a short circuit phenomenon through a projecting remaining portion of the active regions 12. Thus, the manufacturing method of this embodiment may increase a process window of the bit line contact opening 20, so as to increase process yield of the semiconductor memory device 101.

Figure 7:
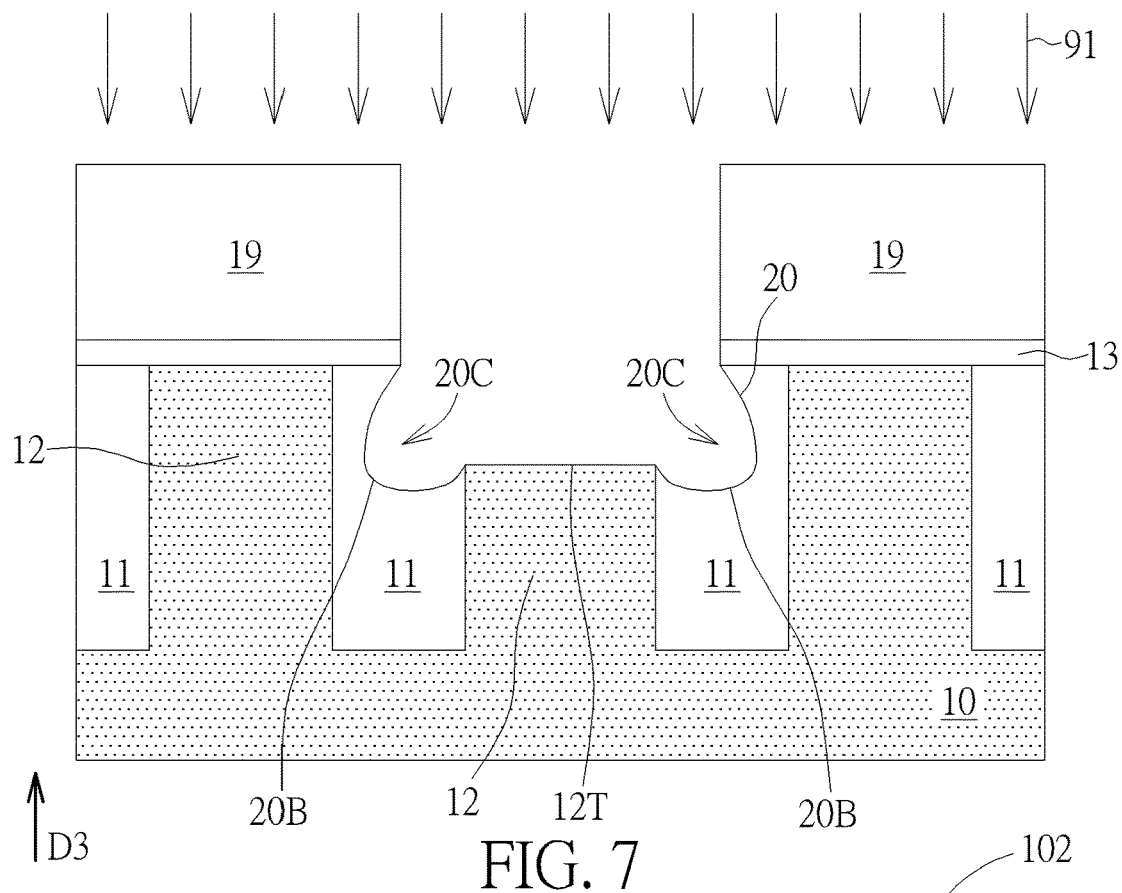
Figure 8:
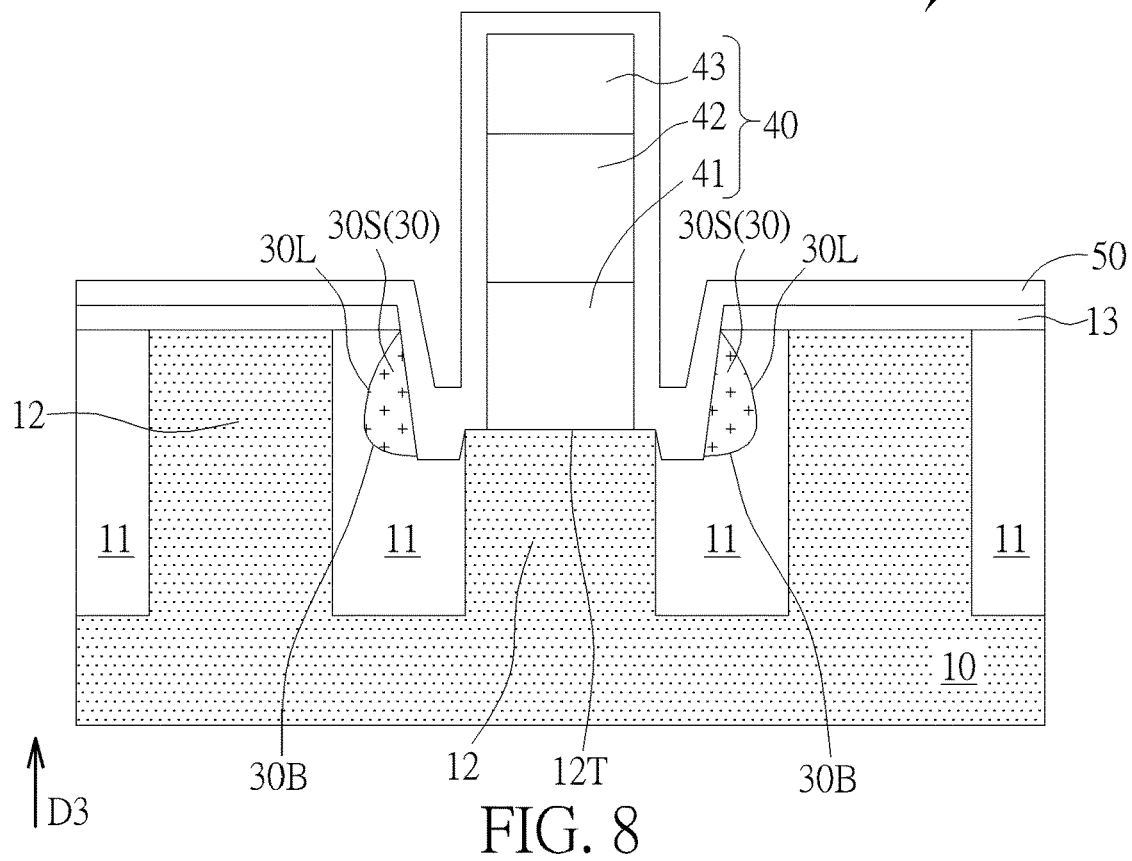

Please refer to FIG. 7 and FIG. 8, FIG. 7 and FIG. 8 are schematic drawings of a manufacturing method of a semiconductor memory device according to a second embodiment of the present invention. As shown in FIG. 7, the first etching process 91 utilized for forming the bit line contact opening 20 of this embodiment is different from the first embodiment. In the first etching process 91 of this embodiment, a processing parameter of the first etching process 91 may be adjusted for making a bottom surface of the under-cut structure 20C of the bit line contact opening 20 (such as a first bottom surface 20B shown in FIG. 7) lower than a top surface 12T of the active region 12 corresponding to the bit line contact opening 20 in the vertical direction D3. In addition, a side surface of the under-cut structure 20C may be a curved surface, but not limited thereto. Therefore, as shown in FIG. 8, in the semiconductor memory device 102, a bottom surface of the isolation structure 30S (such as a second bottom surface 30B shown in FIG. 8) is lower than the top surface 12T of the active region 12 corresponding to the bit line contact opening 20 in the vertical direction D3, and a side surface 30L of the isolation structure 30S includes a curved surface. Moreover, a lowest surface of the spacer layer 50 filled between the isolation structure 30S and the bit line structure 40 may be lower than the top surface 12T of the active region 12 corresponding to the bit line contact opening 20 in the vertical direction D3, but not limited thereto.

To summarize, in the semiconductor memory device and the manufacturing method thereof of the present invention, the edge of the bit line contact opening has the under-cut structure. Since the bottom of the bit line contact opening is wider than the top of the bit line contact opening, the problem of short circuit due to the misalignment in the forming process of the bit line contact opening can be reduced, so as to increase the process window of the bit line contact opening and increase the process yield of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
a semiconductor substrate comprising a plurality of active regions;
a plurality of shallow trench isolations disposed in the semiconductor substrate, wherein each of the plurality of shallow trench isolation is disposed between the plurality of active regions;
a bit line contact opening disposed in one of the plurality of active regions and disposed in the plurality of shallow trench isolations, wherein an edge of the bit line contact opening has an under-cut structure;
a bit line structure partially disposed in the bit line contact opening and in contact with the one of the plurality of active regions corresponding to the bit line contact opening;
an isolation structure disposed in the under-cut structure of the bit line contact opening, wherein a distance between a sidewall of the bit line structure and a topmost portion of an outermost sidewall of the under-cut structure is less than a distance between the sidewall of the bit line structure and a bottommost portion of the outermost sidewall of the under-cut structure; and
a spacer layer, wherein a portion of the spacer layer is disposed between the isolation structure and the bit line structure, and a bottom surface of the portion of the spacer layer disposed between the isolation structure and the bit line structure is lower than a top surface of the one of the plurality of active regions corresponding to the bit line contact opening,
wherein a bottom surface and a side surface of the under-cut structure comprises a curved surface, and the curved surface is lower than the top surface of the one of the plurality of active regions corresponding to the bit line contact opening;
wherein a bottom surface and a side surface of the isolation structure comprises the curved surface, and the curved surface of the bottom surface of the isolation structure is lower than the top surface of the one of the plurality of active regions corresponding to the bit line contact opening.
2. The semiconductor memory device according to claim 1, wherein a part of one of the plurality of shallow trench isolations is disposed under the bit line contact opening, and the portion of the spacer layer disposed between the isolation structure and the bit line structure directly contacts the part of one of the plurality of shallow trench isolations disposed under the bit line contact opening.

3. The semiconductor memory device according to claim 1, wherein the portion of the spacer layer disposed between the isolation structure and the bit line structure directly contacts the one of the plurality of active regions corresponding to the bit line contact opening.

4. The semiconductor memory device according to claim 1, wherein the portion of the spacer layer disposed between the isolation structure and the bit line structure directly contacts a bottommost surface of the bit line contact opening.

5. The semiconductor memory device according to claim 1, wherein the portion of the spacer layer disposed between the isolation structure and the bit line structure directly contacts the isolation structure and the bit line structure.

6. The semiconductor memory device according to claim 1, wherein a bottom of the isolation structure is wider than a top of the isolation structure.

7. The semiconductor memory device according to claim 1, wherein the side surface of the isolation structure directly contacts the outermost sidewall of the under-cut structure.

8. The semiconductor memory device according to claim 1, wherein the outermost sidewall of the under-cut structure is the curved surface.

* * * * *